United States Patent [19]
Lindstedt

[11] Patent Number: 6,064,204
[45] Date of Patent: May 16, 2000

[54] PULSE SEQUENCE FOR A DIAGNOSTIC MAGNETIC RESONANCE APPARATUS

[75] Inventor: Werner Lindstedt, Kalchreuth, Germany

[73] Assignee: Siemens Aktiengesellschaft, Munich, Germany

[21] Appl. No.: 08/971,710

[22] Filed: Nov. 17, 1997

[30] Foreign Application Priority Data

Nov. 29, 1996 [DE] Germany ............... 196 49 699

[51] Int. Cl.$^7$ ....................................... G01V 3/00
[52] U.S. Cl. ............................. 324/309; 324/307
[58] Field of Search ....................... 324/309, 307, 324/306, 311, 312, 300

[56] References Cited

U.S. PATENT DOCUMENTS

| | | | |
|---|---|---|---|
| 4,769,603 | 9/1988 | Oppelt et al. | 324/309 |
| 5,049,820 | 9/1991 | Briand et al. | 324/309 |
| 5,109,197 | 4/1992 | Onodera et al. | 324/309 |

FOREIGN PATENT DOCUMENTS

| | | |
|---|---|---|
| 0 567 194 | 10/1993 | European Pat. Off. . |
| 0 637 756 | 2/1995 | European Pat. Off. . |

OTHER PUBLICATIONS

"An Introduction to NMR Imaging: From the Bloch Equation to the Imaging Equation," Hinshaw et al., Proc. of the IEEE, vol. 71, No. 3, Mar., 1983, pp. 338–350.

Primary Examiner—Louis Arana
Attorney, Agent, or Firm—Hill & Simpson

[57] ABSTRACT

In a method in the form of a pulse sequence for operating a diagnostic magnetic resonance apparatus, a predecessor gradient field and a successor gradient field are generated in an examination volume. The predecessor and successor gradient fields are spatially rotated relative to one another by an angle unequal to 90°. The predecessor gradient and the successor gradient field are generated partially overlapping in time.

15 Claims, 3 Drawing Sheets

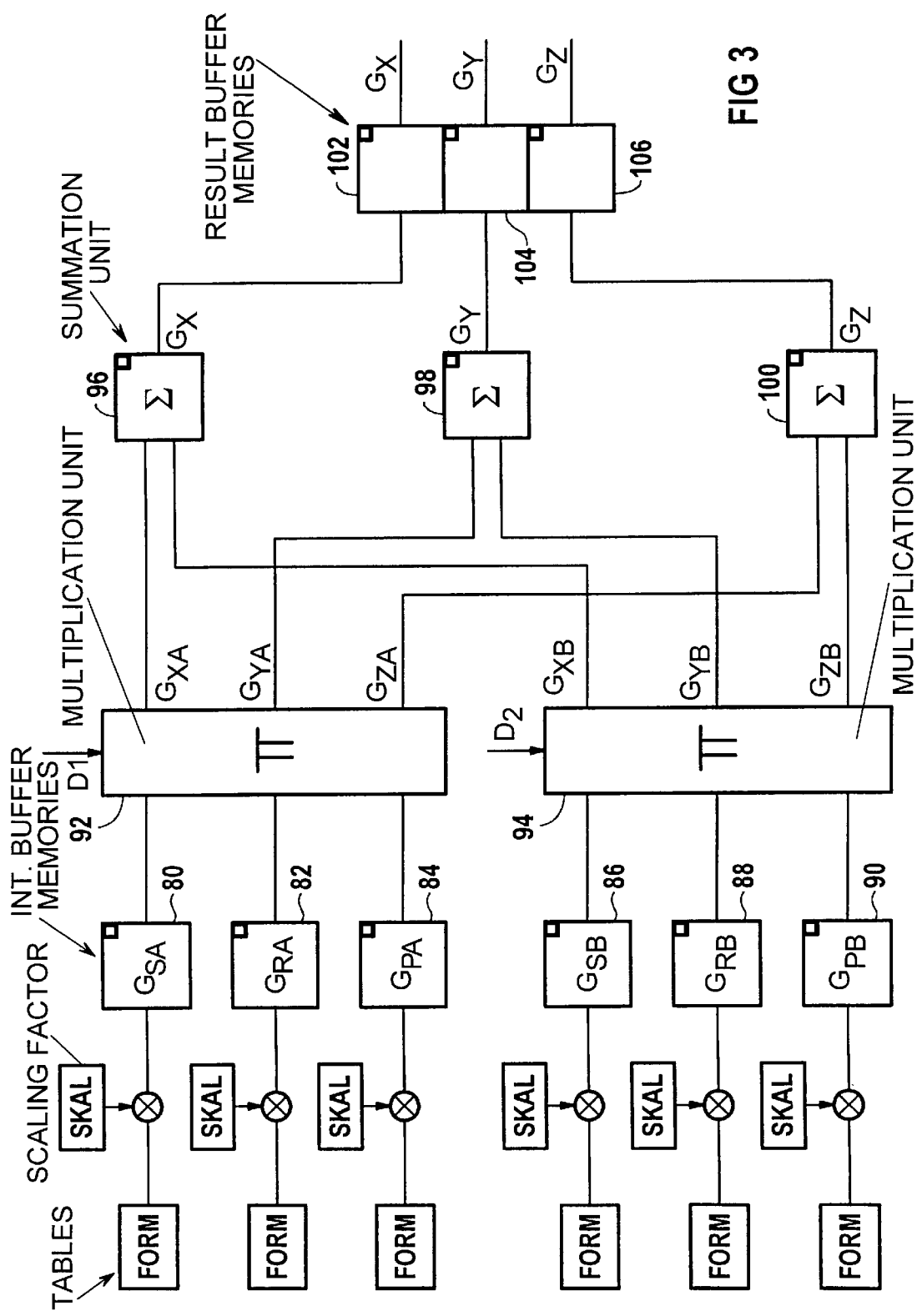

PULSE SEQUENCE FOR A DIAGNOSTIC MAGNETIC RESONANCE APPARATUS

BACKGROUND OF THE INVENTION

The invention is directed to a method, in the form of a pulse sequence, for operating diagnostic magnetic resonance apparatus, of the type having an examination volume in which a predecessor gradient field and a successor gradient field are generated, these being spatially rotated relative to one another by angles unequal to 90°.

DESCRIPTION OF THE PRIOR ART

Due to the complex measurements involved in diagnostic magnetic resonance imaging technology, a number of artifacts can arise in the image. Patient movements—whether intentional or unintentional—are a very frequent reason for artifacts in magnetic resonance imaging. Cardiac activity, blood flow or generally flowing body fluids, respiratory movements, involuntary movements such as peristalsis, swallowing or eye movements as well as accidental patient movements have particular effect on the imaging. All of these movements generate image disturbances; in addition, periodic movements cause ghost images in the phase-encoding direction. A number of methods have been developed for minimizing the motion artifacts, including a pre-saturation of the subject with additional pulses in the pulse sequence. Moving parts are thereby saturated by additional radiofrequency pulses, so that they do not emit any magnetic resonance signals during the course of the actual diagnostic pulse sequence. For example, motion artifacts of a moving abdominal wall can thus be suppressed. Since the saturation slices generally do not have the same orientation as the image slice, for example, a predecessor gradient field with which a slice to be saturated is defined and a successor field, that belongs to another saturation slice or to the actual diagnostic pulse sequence, are spatially rotated relative to one another. Due to rise and decay times of the gradient fields that cannot be left out of consideration, the successor gradient field in conventional pulse sequences is only generated after the predecessor gradient field has entirely decayed.

European Application 0 637 756 A discloses a method and an apparatus with which a number of slices can be quasi-simultaneously excited for magnetic resonance imaging. To that end, a plurality of radiofrequency signals having different frequencies are transmitted into an imaging volume quasi-simultaneously, i.e. with a shortest possible time spacing, while a slice selection gradient field is generated therein. Due to the different frequencies, different slices that are all aligned parallel to one another are excited given the same slice selection gradient. The spatial coding of the magnetic resonance signals emitted from the excited slices, which is required for image generation, ensues in a conventional way with a phase-encoding gradient and a readout gradient that are aligned perpendicular to one another and to the slice selection gradient. The quasi-simultaneous excitation of the magnetic resonance is employed in spin-echo sequences for the pre-saturation of slices and for inversion. The method, however, is limited to slices aligned parallel to one another, whether for imaging or for pre-saturation.

SUMMARY OF THE INVENTION

An object of the present invention is to provide a method, in the form of a pulse sequence for operating a magnetic resonance diagnostic apparatus, the pulse sequence being shortened compared to the initially described pulse sequence in terms of time.

This object is achieved in a method in the form of a pulse sequence wherein the predecessor gradient field and the successor gradient field are generated partially overlapping in time. Since the radio frequency pulses are respectively emitted into the examination volume only in the chronologically constant plateau of the gradient fields, it is particularly the edges of the gradient fields that can be generated overlapping in time without having the gradient fields mutually disturb one another. As a result, the signal acquisition is accelerated and the time of the pulse sequence required overall is shortened.

In an embodiment of the method, reference values are supplied to the gradient system at least in the time-overlapping region of the predecessor gradient field and the successor gradient field, these reference values being formed as a sum of reference values of the predecessor gradient field with reference values of the successor gradient field. The summation can be implemented by the process control computer by processing a corresponding control program.

In a version of this embodiment, the reference values of the predecessor gradient field—in the sense of a first result vector—are formed as a first product of a vector of first source reference values multiplied by a first rotation matrix, and the reference values of the successor gradient field—in the sense of a second result vector —are formed as a second product of a vector of second source reference values multiplied by a second rotation matrix. The two result vectors are added to form a reference vector. The reference vector can then be supplied to the gradient system.

In a further version the reference values proceed into a result buffer memory and are read out therefrom with a DMA (direct memory access controller)or with an interrupt routine and are supplied to the gradient system. The interposition of a result buffer memory assures that a real-time output—triggered by a clock generator—can ensue independently of the rotation matrix multiplications which are previously implemented.

In a further embodiment a substantially simplified program structure is achieved by providing intermediate buffer memory for each component of the first and second source reference values, with the intermediate buffer memories—independently of one another—being loaded with a number of chronologically successive values of the allocated source reference value components.

In another embodiment a saturation region is defined using the predecessor gradient field and a diagnosis region—spatially different from the saturation region—or a further saturation region is defined using successor gradient field.

DESCRIPTION OF THE DRAWINGS

FIG. 3 is a block diagram showing the principal steps for generating the reference values for the gradient system.

DESCRIPTION OF THE PREFERRED EMBODIMENTS

Figure 1:
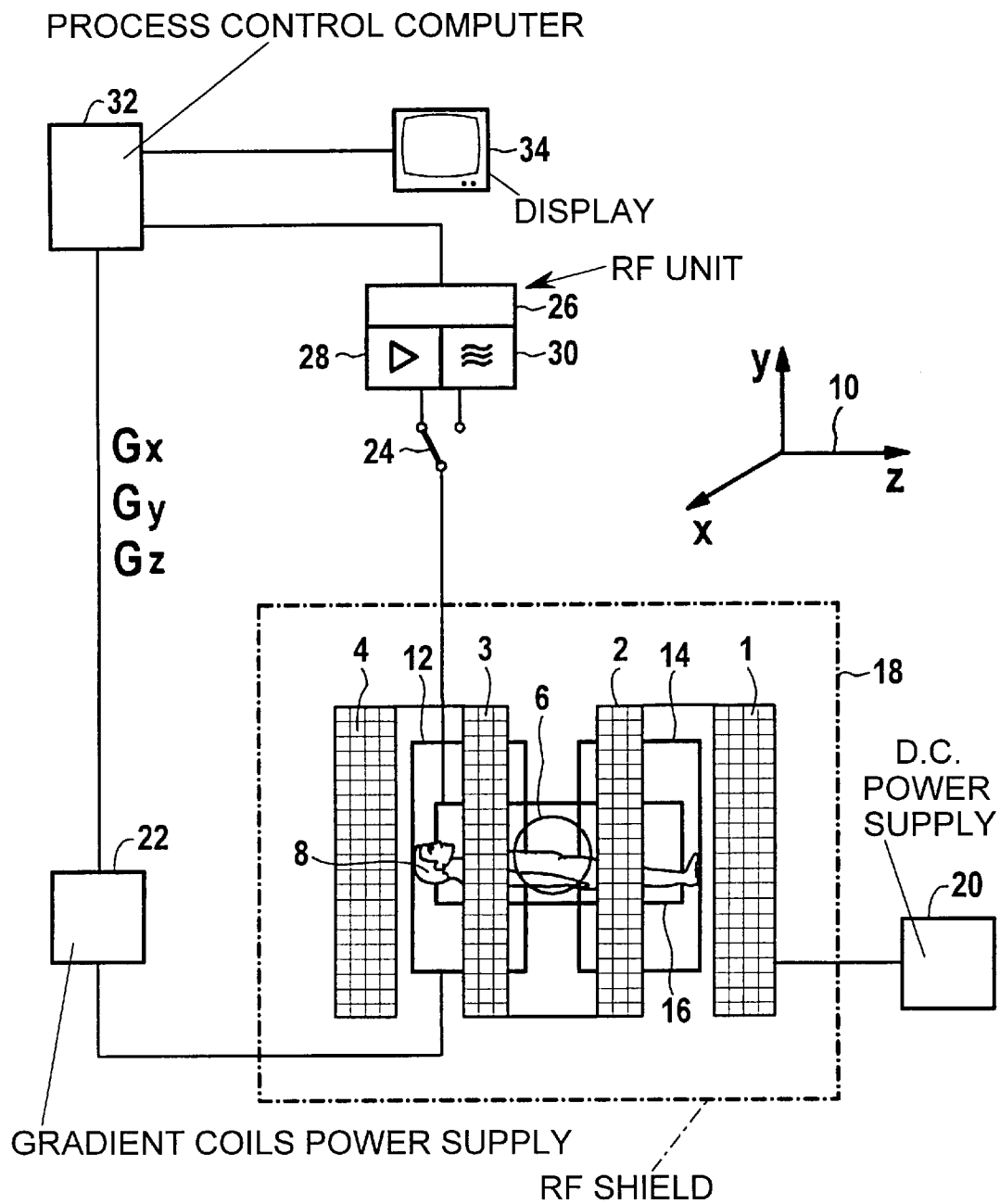
FIG. 1 shows the basic components of a diagnostic magnetic resonance apparatus operable in accordance with the invention.

FIG. 1 shows an overview of a diagnostic magnetic resonance apparatus with which anatomical tomograms and angiograms of the human body can be produced or with which functional examinations can also be implemented. The magnetic resonance apparatus has coils 1 through 4 that generate a high field-strength, nearly uniform basic magnetic field in axial direction. An examination volume 6 is provided in the interior of the coils 1 through 4. Given employment for medical diagnostics, a part of a patient 8 to be examined is located in the examination volume 6. A gradient coil system for generating independent, auxiliary magnetic fields is allocated to the examination volume. As gradient fields, these auxiliary magnetic fields have magnetic field gradients perpendicular to one another in the x, y and z directions of a Cartesian coordinate system 10. For clarity, only gradient coils 12 and 14 are shown in FIG. 1. These coils 12 and 14—together with a pair of identical gradient coils lying opposite—generate a gradient in the x-direction. Identical gradient coils (not shown) for generating a gradient field in the y-direction lie parallel to the patient 8 and above and below the patient 8. Gradient coils (not shown) for generating the gradient field in the z-direction lie at the head and foot ends transversely relative to the longitudinal axis of the patient 8.

The magnetic resonance apparatus also has a radiofrequency antenna 16 employed for the generation and pick-up of magnetic resonance signals.

The coils 1 through 4 bounded by a dot-dash line, the gradient coil system and the radiofrequency antenna 16 represent the actual examination apparatus, which must be largely free of noise signals and is surrounded by a radiofrequency shield. The dot-dash line 18 is intended to symbolize the radiofrequency shield.

The remaining components of the magnetic resonance apparatus are arranged outside the radiofrequency shield 18. A D.C. power supply 20 is provided for the operation of the magnetic coils 1 through 4. A gradient power supply 22 feeds the gradient coil system with the currents needed for the build-up and dismantling of the gradient fields. Together, the gradient power supply 22 and the gradient coil system form the gradient system of the magnetic resonance apparatus. The radio-frequency antenna 16 is connected via a transmission-reception diplexer 24 (shown as a switch) to a radio-frequency unit 26 for signal generation and signal pick-up. The radio-frequency unit 26 comprises a reception amplifier 28 and a radiofrequency transmitter 30. The operation of the magnetic resonance apparatus is controlled by a process control computer 32 to which a monitor 34 is connected via an image computer (not shown in detail). Among other things, the process control computer 32 generates reference values for the gradient fields, these being referenced $G_x$, $G_y$ and $G_z$.

Figure 2:
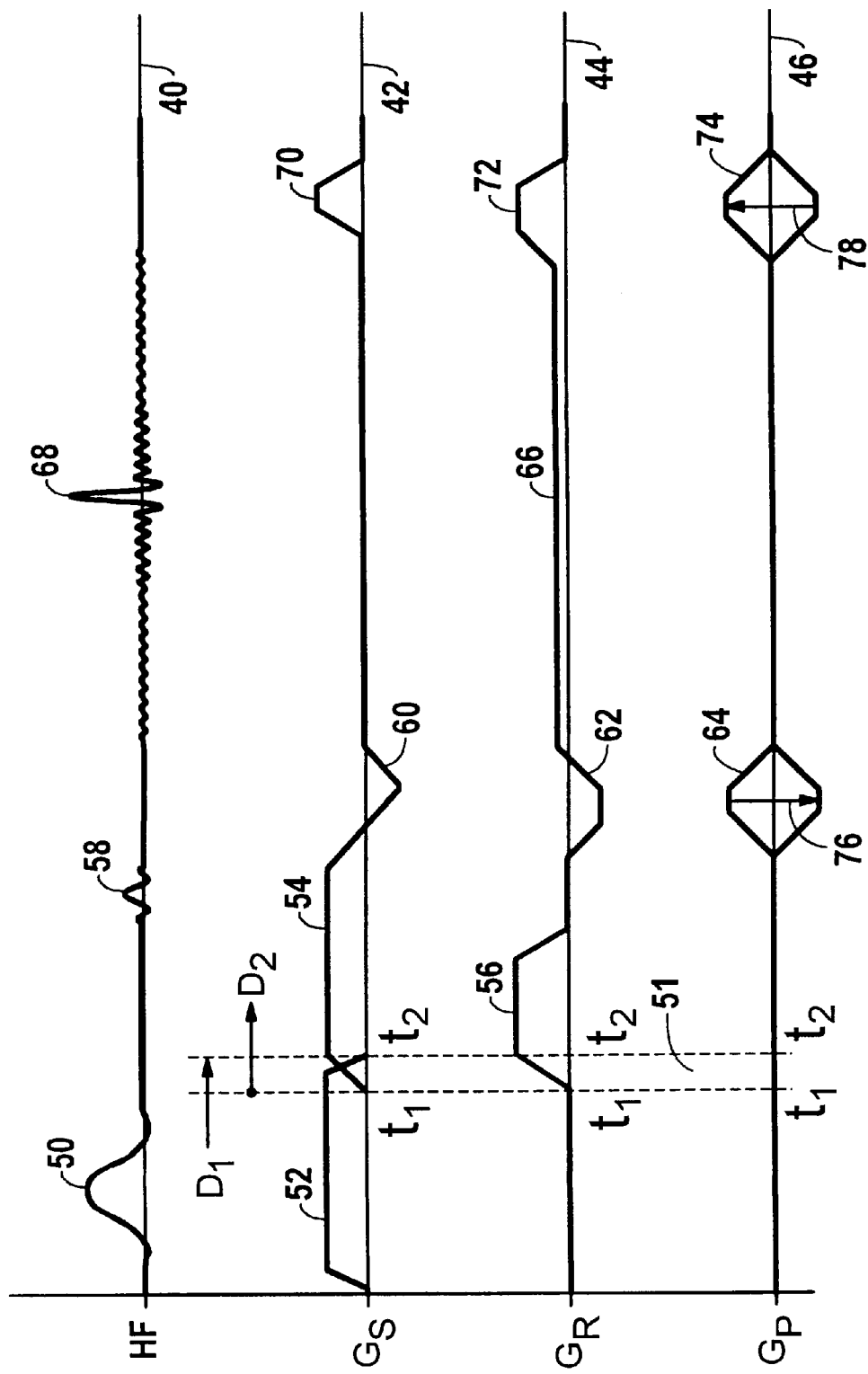
FIG. 2 illustrates a pulse sequence in accordance with the invention, wherein spatially differently aligned and chronologically partially overlapping gradient fields are generated.

FIG. 2 shows the radiofrequency signals and source gradient reference values belonging to a gradient echo pulse sequence—a FLASH 2 D sequence here—in terms of their time allocation. An upper time axis 40 shows radiofrequency pulses (or the envelope thereof) that are generated and received in the pulse sequence. The time curve of a slice selection gradient $G_S$ is shown along a time axis 42. A readout gradient $G_R$ is shown along a time axis 44 in terms of its time curve. The time curve of a phase-coding gradient $G_P$ is shown along a time axis 46. The gradients $G_S$, $G_R$ and $G_P$ reside perpendicularly to one another; as what are referred to as logical gradient values. Their reference values are present in a first coordinate system (SRP coordinate system) as digital supporting points at equidistant intervals of, for example, 10 μs. The source gradient reference values belonging to a time t form a gradient vector having the components $G_S(t)$, $G_R(t)$, $G_P(t)$. The actual physical gradients $G_x$, $G_y$ and $G_z$ are obtained from the logical gradients $G_S$, $G_R$, $G_P$ after a coordinate transformation that effects a rotation of the two coordinate systems relative to one another. As shall be described with reference to FIG. 3, the rotation is generated by a multiplication of the logical gradient values $G_S$, $G_R$, $G_P$ by a rotation matrix that contains the directional cosines of the corresponding coordinate axes.

A first radiofrequency transmission pulse 50 is generated together with a slice selection gradient pulse 52 that is transformed with a rotation matrix $D_1$ into rated values $G_x$, $G_y$ and $G_z$ for the gradient system. A predetermined slice is thus to be saturated, so that no magnetic resonance signals are received from it during the actual diagnostic pulse sequence. The diagnostic pulse sequence begins at time $t_1$, after the radiofrequency transmission pulse 50 has decayed. In order to generate the corresponding gradient reference values $G_x$, $G_y$ and $G_z$, the source reference values $G_S$, $G_R$ and $G_P$ are multiplied by another rotation matrix $D_2$ prescribed by the rotation of the actual imaging slice. From time $t_1$ until time $t_2$, an overlap region 51 of the predecessor gradient field defined by the gradient pulse 52 and the rotation matrix $D_1$ arises with the successor gradient field defined by the gradient pulses 54 and 56 and the rotation matrix $D_2$. The first part of the slice selection gradient pulse 54 and the first part of the readout gradient pulse 56 serve for the dephasing of the excited spins in the corresponding directions. After the readout gradient field is turned off, a radiofrequency pulse 58 for excitation is transmitted with a small flip angle while the slice selection gradient $G_S$ continues to be activated. A phase-coding gradient 64 is applied substantially simultaneously with the negative pulses 60 and 62 of the slice selection gradient GS and of the readout gradient GR. A magnetic resonance signal 68 is then received under the readout gradient pulse 66. The gradient pulses 70, 72 and 74 terminate the pulse sequence for a first phase-encoding direction. Subsequently, further magnetic resonance signals are received with different phase-encoding gradients $G_P$, symbolized by the arrows 76 and 78.

The generation of the overlapping gradient fields is shown in FIG. 3. Intermediate buffer memories 80, 82, 84, 86, 88 and 90 are respectively filled with the source reference values of the corresponding gradients. The index A stands for the predecessor gradient field and the index B stands for the successor gradient field. The index S stands for the logical slice selection gradient, the index R for the logical readout gradient and the index P for the logical phase-encoding gradient. Since the referenced values are generated by software from form tables FORM with corresponding scaling factors SKAL, it is advantageous to respectively load the intermediate buffer memories 80, 82, 84, 86, 88 and 90 with a number of chronologically successive values of the same gradient. Thus, for example, 30 supporting points following one another in time, these covering a time duration of 30×10 μs=300 μs in the time curve of the gradient field, can be read into the intermediate buffers 80, 82, 84, 86, 88 and 90. The source reference values in the SRP coordinate system are then respectively subjected to a multiplication with a rotation matrix $D_1$ in a multiplication unit 92 for the predecessor gradient field (index A) and to a multiplication with a rotation matrix $D_2$ in a multiplication unit 94 for the successor gradient field (index B). The result of the rotation matrix multiplication is a predecessor gradient field (index A) and a successor gradient field (index B) in the actually existing x-, y-, z-coordinate system. The values for the predecessor gradient field and for the successor gradient field are then added in corresponding summation units 96, 98 and 100 and yield the reference values for the gradient fields $G_x$, $G_y$ and $G_z$. The reference values $G_x$, $G_y$, $G_z$ are respectively stored in result buffer memories 102, 104 and 106. The result buffer memories 102, 104 and 106 can be realized as ring buffers or as FIFOs (first in—first out). For example, a DMA controller or an interrupt routine can read three values out in the gradient supporting point grid of, for example, 10 μs and supply the gradient amplifiers 22 while new values are being simultaneously calculated. When three separate read pointers, for example three DMA controllers, are employed for the readout, different transit times of the gradient signals in the gradient hardware can be compensated.

When the intermediate buffer memories 80, 82, 84, 86, 88 and 90 are realized as ring buffer memories or FIFO memories, a first routine can fill these intermediate buffer memories and a second routine can implement the matrix multiplication and the addition.

The method described herein permits, as needed, gradient fields having different alignment also to be completely superimposed, i.e. the physical gradient fields are generated from logical gradient fields with different rotation matrices with subsequent addition.

Although various minor modifications might be suggested by those skilled in the art, it should be understood that I wish to embody within the scope of the patent warranted hereon all such modifications as reasonably and properly come with the scope of my contribution to the art.

I claim as my invention:

1. A method for operating a diagnostic magnetic resonance apparatus having an examination volume, said method comprising a pulse sequence for generating an image of a subject in said examination volume, and comprising the steps of:

generating a predecessor gradient field in said examination volume;

generating a successor gradient field in said examination volume, said predecessor gradient field and said successor gradient field being spatially rotated relative to each other by a non-90° angle; and said predecessor gradient field and said successor gradient field being generated at least partially chronologically overlapping.

2. A method as claimed in claim 1 wherein said predecessor gradient field has a de-activation edge and wherein said successor gradient field has an activation edge, and wherein the step of generating said predecessor gradient field and said successor gradient field at least partially chronologically overlapping comprises chronologically overlapping said de-activation edge of said predecessor gradient field with said activation edge of said successor gradient field.

3. A method as claimed in claim 1 comprising the step of generating said predecessor gradient field by spatially superimposing a plurality of up to three respectively perpendicular gradient field components.

4. A method as claimed in claim 1 comprising the step of generating said successor gradient field by spatially superimposing a plurality of up to three respectively perpendicular gradient field components.

5. A method as claimed in claim 1 comprising the step of generating said predecessor gradient field and said successor gradient field with a single gradient field generating system.

6. A method as claimed in claim 5 comprising the additional steps of:

operating said gradient field generating system using respective reference values for generating said predecessor gradient field and for generating said successor field; and forming said reference values for said gradient field generating system, at least in a region of chronological overlap of said predecessor gradient with said successor gradient, as a sum of reference values for said predecessor gradient field and reference values for said successor gradient field.

7. A method as claimed in claim 6 comprising the additional steps of:

forming said reference values of said predecessor gradient field as a first result vector which is a product of a vector of first source reference values multiplied by a first rotation matrix; and forming said reference values of said successor gradient field as a second result vector which is a product of a vector of second source reference values multiplied by a second rotation matrix.

8. A method as claimed in claim 7 comprising the additional steps of:

forming said first source reference values from three first source reference value components which are independent of each other; and forming said second source reference values from three second source reference value components which are independent of each other.

9. A method as claimed in claim 7 wherein said first source reference values and said second source reference values comprise components in a Cartesian coordinate system.

10. A method as claimed in claim 9 comprising the additional steps of:

storing said reference values in digital form in a result buffer memory; and reading said reference values from said result buffer memory and supplying said reference values to said gradient field generating system.

11. A method as claimed in claim 10 wherein the step of reading said reference values from said result buffer memory comprises reading said reference values from said result buffer memory with a DMA controller.

12. A method as claimed in claim 10 wherein the step of reading said reference values from said result buffer memory comprises reading said reference values from said result buffer memory with an interrupt routine.

13. A method as claimed in claim 10 comprising the additional steps of:

providing a plurality of intermediate buffer memories preceding said result buffer memory and dedicating said intermediate buffer memories for storage of respective components of said first and second reference values, with one component per intermediate buffer memory; and loading the respective intermediate buffer memories independently of each other with respective pluralities of chronologically successive values of the first and second source reference value components.

14. A method as claimed in claim 1 comprising the additional steps of:

defining a saturation region of said subject using said predecessor gradient field; and defining a diagnosis region which is spatially different from said saturation region using said successor gradient field.

15. A method as claimed in claim 1 comprising the additional steps of:

defining a saturation region of said subject using said predecessor gradient field; and defining a further saturation region which is spatially different from said saturation region using said successor gradient field.

* * * * *